(12) United States Patent
Arena

(10) Patent No.: US 8,247,314 B2
(45) Date of Patent: Aug. 21, 2012

(54) METHODS FOR IMPROVING THE QUALITY OF STRUCTURES COMPRISING SEMICONDUCTOR MATERIALS

(75) Inventor: Chantal Arena, Mesa, AZ (US)

(73) Assignee: Soitec, Bernin (FR)

( * ) Notice: Subject to any disclaimer, the term of this patent is extended or adjusted under 35 U.S.C. 154(b) by 447 days.

(21) Appl. No.: 12/618,500

(22) Filed: Nov. 13, 2009

(65) Prior Publication Data

US 2010/0124814 A1 May 20, 2010

Related U.S. Application Data

(60) Provisional application No. 61/114,855, filed on Nov. 14, 2008.

(51) Int. Cl.
*H01L 21/20* (2006.01)
(52) U.S. Cl. ........................................ 438/481; 438/478
(58) Field of Classification Search .................. 438/478, 438/481
See application file for complete search history.

(56) References Cited

U.S. PATENT DOCUMENTS

| | | | |
|---|---|---|---|
| 7,364,805 B2 | 4/2008 | Morita et al. | 428/698 |
| 7,732,306 B2 * | 6/2010 | Arena et al. | 438/481 |
| 2002/0005593 A1 | 1/2002 | Bourret-Courchesne | 257/790 |
| 2002/0069817 A1 | 6/2002 | Mishra et al. | 117/84 |
| 2003/0180580 A1 | 9/2003 | Wada et al. | 428/698 |
| 2004/0067648 A1 | 4/2004 | Morita et al. | 438/689 |
| 2007/0125996 A1 | 6/2007 | Morita et al. | 257/11 |
| 2007/0259464 A1 | 11/2007 | Bour et al. | 438/341 |
| 2007/0259504 A1 * | 11/2007 | Bour et al. | 438/341 |
| 2008/0099781 A1 | 5/2008 | Choi et al. | 257/103 |

FOREIGN PATENT DOCUMENTS

WO WO 2008/141324 A2 11/2008

OTHER PUBLICATIONS

International Search Report and Written Opinion of the International Searching Authority, application No. PCT/US2009/064330, Feb. 4, 2010.
Beaumont et al., "A Two-Step Method for Epitaxial Lateral Overgrowth of GaN," phys. stat. sol. (a) 176: 567-571 (1999).
Hiramatsu et al., "Fabrication and characterization of low defect density GaN using facet-controlled epitaxial lateral overgrowth (FACELO)," Journal of Crystal Growth 221: 316-326 (2000).

(Continued)

*Primary Examiner* — Bradley K Smith
(74) *Attorney, Agent, or Firm* — Winston & Strawn LLP

(57) ABSTRACT

Methods which can be applied during the epitaxial growth of semiconductor structures and layers of III-nitride materials so that the qualities of successive layers are successively improved. An intermediate epitaxial layer is grown on an initial surface so that growth pits form at surface dislocations present in the initial surface. A following layer is then grown on the intermediate layer according to the known phenomena of epitaxial lateral overgrowth so it extends laterally and encloses at least the agglomerations of intersecting growth pits. Preferably, prior to growing the following layer, a discontinuous film of a dielectric material is deposited so that the dielectric material deposits discontinuously so as to reduce the number of dislocations in the laterally growing material. The methods of the invention can be performed multiple times to the same structure. Also, semiconductor structures fabricated by these methods.

7 Claims, 8 Drawing Sheets

OTHER PUBLICATIONS

Miyake et al., "High Quality GaN Grown by Facet-Controlled ELO (FACELO) Technique," phys. stat. sol. (a) 194(2): 545-549 (2002).

Qhalid Fareed et al., "Vertically faceted lateral overgrowth of GaN on SiC with conducting buffer layers using pulsed metalorganic chemical vapor deposition," Applied Physics Letters 77(15): 2343-2345 (2000).

Zhou et al., "Morphology Controllable ZnO Growth on Facet-Controlled Epitaxial Lateral Overgrown GaN/Sapphire Templates," J. Phys. Chem. C 111(17): 6405-6410 (2007).

Iwaya et al., "Reduction of Etch Pit Density in Organomettalic Vapor Phase Epitaxy-Grown GaN On Sapphire by Insertion of A Low-Temperature-Deposited Buffer Layer Between High-Temperature-Grown GaN", Japanese Journal of Applied Physics, vol. 37, pp. L316-L318, (1998).

Tanaka et al., "Anti-Surfactant in III-Nitride Epitaxy-Quantum Dot Formation and Dislocation Termination", Japanese Journal of Applied Physics, vol. 39, pp. L831-L834, (2000).

Zang et al., "Defect Reduction by Periodic $SiN_x$ Interlayers in Gallium Nitride Grown on Si (111)", Journal of Applied Physics, vol. 101, pp. 093502-1-093502-2 (2007).

International Preliminary Report on Patentability PCT/US2009/064330, mailed May 26, 2011.

* cited by examiner

METHODS FOR IMPROVING THE QUALITY OF STRUCTURES COMPRISING SEMICONDUCTOR MATERIALS

This application claims the benefit of provisional application 61/114,855 filed Nov. 14, 2008, and the entire content of it is expressly incorporated herein by reference thereto.

FIELD OF THE INVENTION

The invention relates to the fabrication of semiconductor structures, and in particular to the epitaxial growth of high crystal quality structures comprising III-nitride materials. Embodiments of the invention include methods for improving the crystal quality of a semiconductor structure, and structures fabricated utilizing these methods.

BACKGROUND OF THE INVENTION

The quality of a semiconductor material can considerably influence the performance of a solid-state device produced from said material. Solid-state devices can suffer from inferior lifetimes and operating characteristics when the semiconductor material has an undesirable density of crystal defects, for example dislocations. Such problems have hindered the development of semiconductors including gallium nitride (GaN), other Group III-nitrides (e.g., AlN, InN, GaInN) and other mixed nitrides (referred to herein as "III-nitrides") as well as certain Group III-V compounds; and of certain other compound materials (e.g., IV, II-VI materials) generally. For many of these materials suitable and commercially useful growth substrates have limited availability and poor crystal quality. A suitable substrate closely matches the crystal properties of the target material to be grown; if these properties do not closely match, the resulting material usually has an unacceptable density of dislocations.

Specifically, in the case of GaN, crystal quality can be improved by pre-treatment of the growth substrates, e.g., by nitridization and other chemical modifications; by growing thin, low temperature buffer layers of other III nitrides, e.g., AlN or GaN, by thermal annealing, and the like. Methods such as epitaxial lateral overgrowth (ELO) and its variants (PENDEO, FIELO, etc) have proven successful in reducing dislocation density. However, these common methods often utilize lithographically produced masking elements that often produce materials with a non-uniform distribution of surface dislocations, undesirable in many applications. Some alternative methods of dislocation reduction for producing homogenous surface dislocation densities have utilized in-situ (or ex-situ) deposition methods to impede dislocation progression, in some instances with the addition of etchants to enhance surface dislocation dimensions. Examples of such impeding methods include US patent publication US2007/0259504, Tanaka et al. Japanese Journal of Applied Physics 39 L831 2000 and Zang et al. Journal of Applied Physics 101 093502 2007. Further alternative methods of dislocation reduction aim to limit dislocation propagation into the growing layer by, at an intermediate stage of growth of a GaN layer, enhancing defects present at the surface of the GaN layer by etching, then plugging plugging the enhanced surface defects with a masking material on which GaN does not readily nucleate, and then continuing GaN growth. Examples of such methods include U.S. provisional patent application 61/127,720 filed May 14, 2008, which is incorporated herein by reference in its entirety.

Layers and crystals of III-nitrides of improved quality are desirable. Although applicable processes for doing so are available in the prior art and succeed to a certain degree in reducing the dislocation density in III-nitride materials, a method capable of producing greater dislocation reduction and uniformity of distribution is desirable.

SUMMARY OF THE INVENTION

The present invention provides systems and methods for fabricating semiconductor structures and in particular fabricating semiconductor structures comprising III-nitride materials. Methods of the invention can fabricate semiconductor layers with improved crystal qualities, e.g. with fewer dislocations, in comparison to the state of the art. The invention also provides semiconductor structures fabricated by these methods.

Generally, methods of the present invention produce better-quality, following semiconductor layers (or "final" or "overlying" or "over grown" layers, or the like) by taking advantage of certain types of dislocations commonly found in poorer-quality starting layers (or "substrates", "initial" or "underlying" layers, or the like).

It has been found that, up to a point, the more prominent the surface extent of dislocations in a starting or underlying surface, the better the quality of a following layer ultimately fabricated from such a starting or underlying surface. It is believed (but without intended limitation) that this surprising outcome results from the interplay of a number of factors.

First, the dislocations in an underlying semiconductor surface may be enclosed and terminated, in such a manner, and a final layer can be grown in such a manner, that the terminated dislocations do not propagate into the final layer. The final layer can then have fewer dislocations than the underlying surface because those dislocations in the underlying surface that have been successfully enclosed and terminated are not represented in the final layer. Second, it has been found that the common surface indentation (e.g. a pit like structure) spontaneously produced at dislocations in an underlying surface can be enhanced, e.g., made larger in surface cross section (e.g. increased in size for both lateral and depth dimensions), such that they can be more effectively terminate associated dislocations when compared with less enhanced dislocations. Finally, it has been found that conditions encouraging the intersection of two or more enhanced dislocations further enhances the termination of associated dislocations and thus increases both the dislocation termination efficiency and the efficiency of dislocation reduction. Accordingly, a final layer grown from an underlying surface having enhanced and enclosed dislocations can then have even fewer dislocations than the underlying layer.

Briefly, beginning with an underlying surface of a suitable semiconductor material, methods of the invention fabricate a following layer of improved quality by steps comprising enhancing the common surface indentation spontaneously produced at selected dislocations present at the underlying surface. Subsequent processes then grow a following layer having few or no dislocations arising from the enhanced dislocations in the underlying surface.

In embodiments of the invention, an advantageous method of enhancing the common surface indentation spontaneously produced at dislocations comprises growing an intermediate layer (or layers) having enhanced openings induced by some or all of the dislocations in an underlying surface and grown in a manner such that the induced openings become progressively enhanced as the intermediate layer grows. Additional embodiments of the invention promote the intersection of two or more such enhanced dislocations to a produce an agglomeration (or "clustering" or "bunching") of enhanced dislocations as the intermediate layer (or agglomeration layer) grows.

Enhancing surface indentations (e.g. pit like structures) spontaneously produced at dislocation emergences includes enlarging their sizes (e.g. depth, width, and surface cross section). Enhancing can occur as the intermediate layer grows in thickness. Such enhancing is also referred to as "opening" of dislocations, i.e., the intermediate layer is grown under conditions so as to "open" dislocations.

The intermediate layer is also grown in such a manner that the enlarging of the common surface indentations spontaneously produced at dislocations results in the intersection of two or more such surface openings. Such intersecting of two or more openings (or pits) is referred to as pit "agglomeration" or pit "clustering", i.e. the intermediate layer is grown under conditions so as to "open" the relevant types of dislocations the "openings" intersecting one or more other "openings" to form an agglomeration or clustering of openings.

In additional embodiments of the invention, a further advantageous method of enhancing dislocations includes treating the surface with etching agents selected to encourage the enlarging of the dislocation pits, i.e. to open (or to "decorate") the natural indentations found at the surface of the underlying material to form "etch pits". As with growth of an intermediate layer, enhancing can occur as the etching process proceeds thereby "deepening" and "opening" of dislocations so as to produce "open" dislocations. Proper etching conditions can also lead to intersection of two or more such surface openings or disturbances about the surface emergences of bulk dislocations producing pit "agglomerations" or pit "clusterings" similar to those produced in an intermediate layer.

Finally, an advantageous method of terminating the dislocations comprises laterally growing over or from within the agglomeration of openings, induced by the dislocations, with a lateral growth layer. The lateral growth layer can comprise materials (e.g., III-nitride materials) selected to have crystalline properties substantially similar to those of the underlying layers. This growth step begins under conditions selected to promote such lateral growth, and continues, if necessary, under condition selected to promote more vertical growth until a desired layer thickness has been reached.

In preferred embodiments, prior to terminating the dislocations, the invention includes depositing a discontinuous film of a dielectric material, such as a silicon nitride or oxide in the case of a III-nitride semiconductor. By choice of appropriate deposition (and/or post deposition conditions), it has been found that the dielectric material deposits discontinuously so as to reduce the number of dislocations in the laterally growing material. It is believed that this is because the discontinuous deposition occurs in the disordered regions about emergent dislocations so as to discourage subsequent lateral growth from more disordered regions about the emergent dislocations (which would promote the propagation of dislocations into the growing material) and to encourage subsequent lateral growth from less disordered regions about dislocations (which hinders the propagation of dislocations into the laterally growing material).

The invention also includes performance of the above steps in various combinations and orders. For example, surface-emergent dislocations can be enhanced by careful growth of an intermediate layer on an initial surface, or by careful etching of the initial surface, or by growth of an intermediate layer followed by careful etching, or by etching followed by growth of an intermediate layer (optionally followed by a further careful etching). Lastly, a following layer with reduced dislocations is grown laterally following careful deposition of a discontinuous layer of a dielectric material.

The invention is usefully applied to those ("suitable") semiconductor materials in which occur types of dislocations that can be efficiently and reliably enclosed e.g., by enhancement and then lateral growth, and which can be grown by processes such that enclosed dislocations in an underlying surface induce few or no dislocations in an overlying layer. The types of dislocations selected for enclosure by the invention can differ among different suitable semiconductor materials, as can methods of enclosing dislocations of the selected types and methods of growing the material over surfaces with processed dislocations.

Semiconductor materials comprising III-nitrides, and especially materials comprising GaN, have been found to be particularly suitable materials. Accordingly, the following description is largely directed to such embodiments that fabricate layers comprising III-nitride materials. However, it should be understood that the present invention is not limited to III-nitride materials, and can usefully be applied to other materials.

The present invention provides both methods for fabricating semiconductor structures and the semiconductor structures fabricated by the provided methods. In more detail, these methods include epitaxially growing a layer of semiconductor material on an initial semiconductor surface with a plurality of emergent surface dislocations, that first forms an intermediate semiconductor layer having growth pits and agglomerations of growth pits by epitaxial growth on the initial surface under first epitaxial growth conditions selected to encourage opening of growth pits associated with the surface dislocations, and then subsequently under second epitaxial growth conditions selected to encourage intersection of two or more growth pits into agglomerations of growth pits, and then second forms a substantially continuous following semiconductor layer having fewer surface dislocations than the initial semiconductor surface by epitaxial growth on the intermediate layer under third epitaxial growth conditions selected to encourage lateral growth over or from within some or all of the growth pits and the agglomerations of growth pits.

The methods of the invention also include forming a III-nitride semiconductor structure, the semiconductor structure having an initial III-nitride surface with a plurality of emergent dislocations, that epitaxially grows following III-nitride semiconductor layer under a sequence of growth conditions selected so as to encourage, first, opening of growth pits associated with the surface dislocations, then second, intersection of two or more of the opened growth pits into agglomerations of growth pits, and third lateral growth over or from within some or all of the growth pits and the agglomerations of growth pits at least until formation of a substantially continuous layer, wherein the dislocation density in the substantially continuous layer is less than the dislocation density on the initial surface.

Also, the sequence of growth conditions can be entirely carried out in a single growth chamber without removal of the III-nitride semiconductor structure from the growth chamber, and further, repeating the sequence of growth conditions without removal of the III-nitride layer being formed from the growth chamber. The opening and intersection of growth pits continues preferably as long as a plurality of individual growth pits have lateral extents of less than about 5 µm.

Aspects of these methods include repeating the steps of forming the intermediate layer and of forming the substantially continuous following layer two or more times; prior to forming the intermediate semiconductor layer; prior to forming the substantially continuous following semiconductor layer; and applying a discontinuous layer of a dielectric masking material to the intermediate layer.

Aspects of the methods also include growth condition for encouraging the opening of growth pits and for encouraging the intersection of growth pits that are substantially similar; growth conditions for encouraging the opening and intersection of growth pits comprise temperatures of less than 950° C., pressures of greater than about 100 mb, or both.

The present invention also provides a III-nitride semiconductor structure having a first layer having a plurality of defects propagating within the layer and a plurality of voids, each void associated with one of more of the propagating defects; and a substantially continuous following layer overlying lateral overgrowth layer with substantially no voids and having fewer propagating defects than in the first layer.

This structure can have a plurality of the voids have a narrower apex within the first layer at which at least one defect terminates, and have broader bases adjacent to the boundary with the following layer; a plurality of pairs of a first layer and a following layer, each pair directly overlying a previous pair; dislocations emerging at the surface of the following layer are distributed substantially uniformly over the surface; one or both of the intermediate layer and of the following layer with thicknesses of between about 0.1 μm and 1.5 μm and preferably less than about 1 μm.

The term "substantially" is used herein to refer to a result that is complete except for the deficiencies normally expected in the art. For example, an epitaxial layer cannot routinely be expected to be completely continuous (or completely monocrystalline, or completely of one crystal polarity) across macroscopic dimensions. However, an epitaxial layer can routinely be expected to be "substantially continuous" (or "substantially monocrystalline", or "substantially of one crystal polarity") across macroscopic dimensions where the discontinuities (or crystal domains, or crystal boundaries) present are those expected in the art for the processing conditions, the material quality sought, or so forth.

Further, a semiconductor layer having "substantially no dislocations" is used herein to mean that the semiconductor layer has a density of dislocations that is at least low or a very low in comparison to what is common in the art for the material of the semiconductor layer. For example, in the case of GaN, "substantially no dislocations" (or a low or very low density of dislocations) is taken to refer to herein to dislocation densities of less than approximately on the order of $10^6/cm^2$, and especially less than approximately on the order of $10^5/cm^2$. The dislocation density in the group III nitrides is measured by methods well know to those familiar in the art, including, atomic force microscopy, optical microscopy, scanning electron microscopy and transmission electron microscopy. The preferred method for measuring the dislocation density is by transmission electron microscopy (TEM).

Headings are used herein for clarity only and without any intended limitation. A number of references are cited herein, the entire disclosures of which are incorporated herein, in their entirety, by reference for all purposes. Further, none of the cited references, regardless of how characterized above, is admitted as prior to the invention of the subject matter claimed herein. Further aspects and details and alternate combinations of the elements of this invention will be apparent from the following detailed description and are also within the scope of the inventor's invention.

BRIEF DESCRIPTION OF THE DRAWINGS

The present invention may be more fully understood by reference to the following detailed description of the embodiments of the invention, illustrative examples of specific embodiments of the invention and the appended figures in which:

FIG. 1Bb illustrates a further alternative embodiment;

DETAILED DESCRIPTION OF THE PREFERRED EMBODIMENTS

Figure 1A:
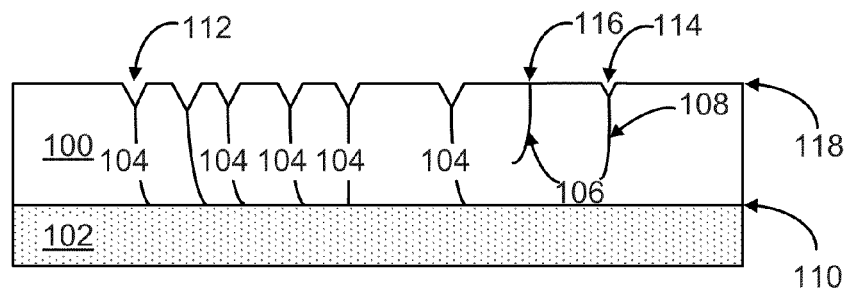
FIGS. 1A, 1B, 1C, and 1D schematically illustrate an embodiment of the invention.

Although the following description is predominantly directed towards embodiments that fabricate layers comprising III-nitride materials, it should be understood that embodiments are not limited to such materials. Therefore, without limitation, embodiments of the invention substantially prevent dislocations that are present at a surface layer of a semiconductor structure from being present at a following surface layer of the structure, such that the following surface of the structure can have improved quality. These methods can be performed once to improve the quality of the following layer, or can be performed two or more times to successively improve the quality of successive following layers.

Briefly, beginning with an underlying surface comprising a III-nitride (or other) material, methods of the invention grow a following (or "final") layer of improved quality. The steps comprise enhancing the surface extent (i.e. width and depth) of the dislocations already present at the underlying surface, forming agglomerations of enhanced dislocations by promoting the intersection of enhanced dislocations, and then enclosing the enhanced dislocations by growing over or within the agglomerations of enhanced dislocations with a following layer of material having few or no dislocations.

In embodiments of the invention directed to III-nitride materials, dislocations are enhanced preferably by epitaxially growing, an intermediate layer (or layers) of a same or different III-nitride material. The intermediate layer(s) include growth pits associated with already-present, surface dislocations in an underlying III-nitride surface and are induced by and at the locations of some or all of the dislocations in the underlying.

The intermediate layer is grown so that the surface openings (e.g. the width and depth) of the growth pits gradually increase, in other words, so that the growth pits open. Growth pits usually have an inverted-pyramid-type form, so that during growth of the intermediate layer, the growth pits tend to naturally broaden and deepen and become progressively enhanced ("open") as the thickness of the intermediate layer increases. All or substantially all of the growth pits include a dislocation located at the apex of the inverted pyramid type structure. Therefore, upon opening of the growth pit the originating dislocation is proximate to a voided region produced by the growth pit.

In addition to promoting the opening of growth pits, the underlying layer and the intermediate layer are formed in such a way so as to promote the intersection of two or more growth pits, such that the combined surface opening of the intersecting growth pits increases as the total lateral extent of the surface opening in the intermediate layer. A group (two or more) of intersecting growth pits is referred to herein as an "agglomeration" or "pit agglomeration", and the surface opening of a pit agglomeration is referred to as an "agglomeration area". The surface of the intermediate layer therefore comprises a plurality of agglomeration areas produced by the intersection of two or more growth pits. An agglomeration area comprises a number dislocations located at the base of the area (i.e. the apex of the individual inverted pyramids) and an expansive voided region resulting from the combined internal voided volumes of the intersecting growth pits. Thereby, the surface openings of growth pits can be enhanced or even greatly enhanced.

It can be appreciated, therefore, that according to the invention a first step in producing a layer of increased quality is to produce an intermediate layer comprising a plurality of intersecting growth pits that form a plurality of pit agglomerations. Such an intermediate layer having enhanced agglomerated growth pits is also referred to herein as a "pitted" layer.

In further embodiments of the invention an additional step comprises treating (preferably by etching) an underlying surface to particularly encourage positioning of enhanced dislocations (i.e. growth pits) in an intermediate layer at dislocations present in the underlying surface. Such an etching step can occur preferably before growth of an intermediate layer, but can also occur after growth of the intermediate layer, and can even be performed alone without growth of an intermediate layer.

Once formed the agglomerated growth pit openings induced via dislocations in the underlying surface layer are enclosed and covered with a continuous uniform following layer of III-nitride. The sizes of the agglomerated areas of the growth pits are therefore preferably adjusted by, e.g., the thickness of the intermediate layer, density of defects in the initial layer, the growth condition etc., so that the surface extent of the intersecting growth pit openings are sufficiently sized so that ELO processes bridge (or span) a multitude of dislocations producing a continuous surface.

In other words, the intermediate layer is grown so as to open and intersect a plurality of growth pits to produce surface opening with a size suitable to cluster a plurality of dislocations at the base of the enhanced pit opening. Therefore, subsequent lateral growth of a following III-nitride layer encloses the enhanced surface opening preventing further propagation of the underlying dislocations.

The surface distribution of dislocations across a final surface will be substantially uniform (up to statistical fluctuations) if the distribution of dislocations across an initial surface is similarly uniform. This is because the steps of the invention randomly reduce the number of initial dislocations without significant, if any, surface bias. Therefore, as the number of initial dislocations is reduced, their distribution is largely preserved. For example, the random distribution of dislocations present at an initial surface will be enhanced during subsequent growth of an intermediate layer thereon (or surface etching), and the random distribution of the enhanced dislocations present at the surface of an intermediate layer (or etched initial layer) will successfully be enclosed during subsequent dislocation processing. Accordingly, if a random surface distribution of dislocations is desirable, it is preferable to start with an initial surface also having a random surface distribution of dislocations.

The invention also includes III-nitride semiconductor structures produced by the above methods. Such structures have observable evidence of such enhanced and intersecting growth pits and dislocations arranged in planes representing the surfaces of the intermediate layers in which they were formed.

More detailed descriptions of various embodiments of the invention are now presented, beginning with the embodiments of FIGS. 1 A-D. These figures illustrate the principal features of preferred embodiments in a schematic manner. In particular, these figures are not to scale, illustrate exemplary dislocations, and are not representative of the actual performance of this invention in improving quality. It should also be noted that although much of the following description of the preferred embodiments of the invention are specific to gallium nitride layers, this should not be construed as limiting the invention to said material but encompasses the whole family of the III-nitride and other semiconductor materials.

Figure 1B:
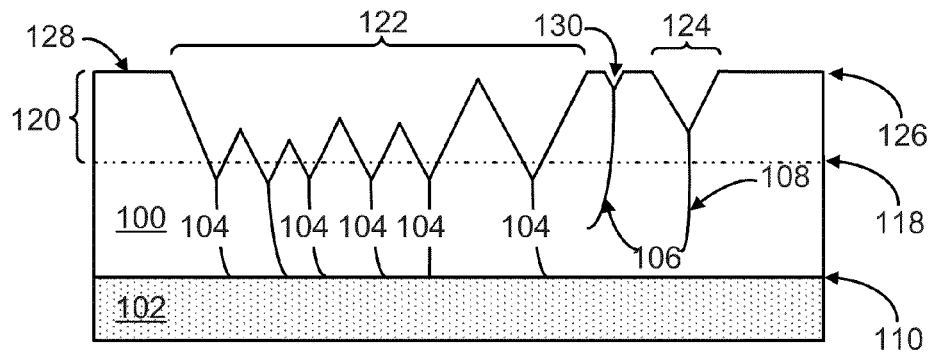

FIG. 1A illustrates an initial gallium nitride semiconductor layer that has been epitaxially grown (or otherwise placed or transferred) on a substrate and that has dislocations emerging at its surface. FIG. 1B illustrates the results of a first step of a preferred embodiment that produces an intermediate layer with a surface including a plurality of intersecting "pits" (or intersecting hollows, cavities, depressions etc) (equivalently, a "pitted intermediate" layer, or "pitted" layer, or the like). The intersecting pits (equivalently, agglomerated or clustered areas of "growth" pits) of the "pitted" layer are induced by all or a substantial number of the dislocations present at the surface of the initial gallium nitride layer. The intersection of a number of growth pits produces extend voided regions with a number of dislocations located primarily at the base of the regions.

FIG. 1Bb illustrates a preferred embodiment in which a dielectric layer of material is deposited to assist in dislocation reduction; such methods of the invention are described later in greater detail. In this embodiment, a thin layer of masking material 131 is applied to the surface of the pitted intermediate layer 120 preferably in a manner so that a portion of side facets of the growth pits and agglomerated growth pits (preferably the more disordered portions) are covered while leaving the remaining portions (preferably the less disordered portions) and the unpitted planar material accessible for subsequent material growth. Preferred masking materials comprise substances which act as anti-surfactants to III nitride growth, thereby limiting the amount of nucleation in masked portions of the structure of FIG. 1Bb.

Figure 1C:
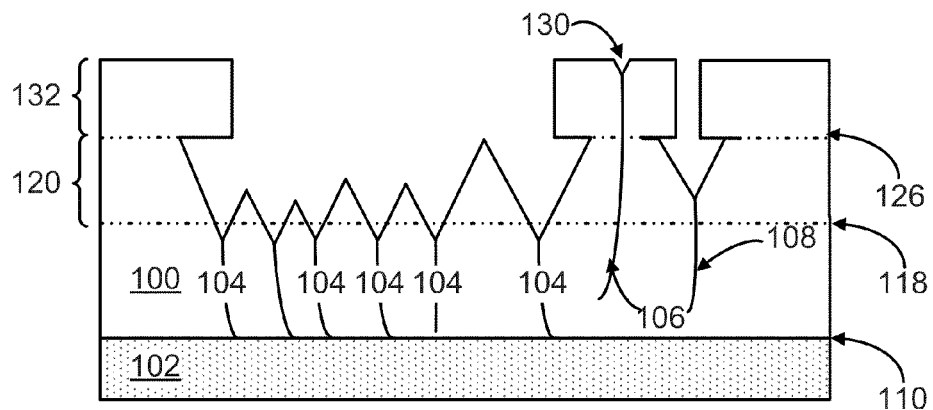
Figure 1B:
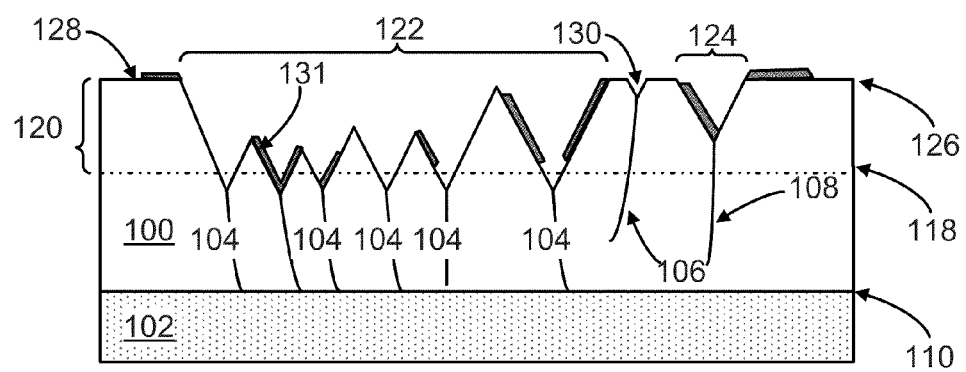
Figure 1D:
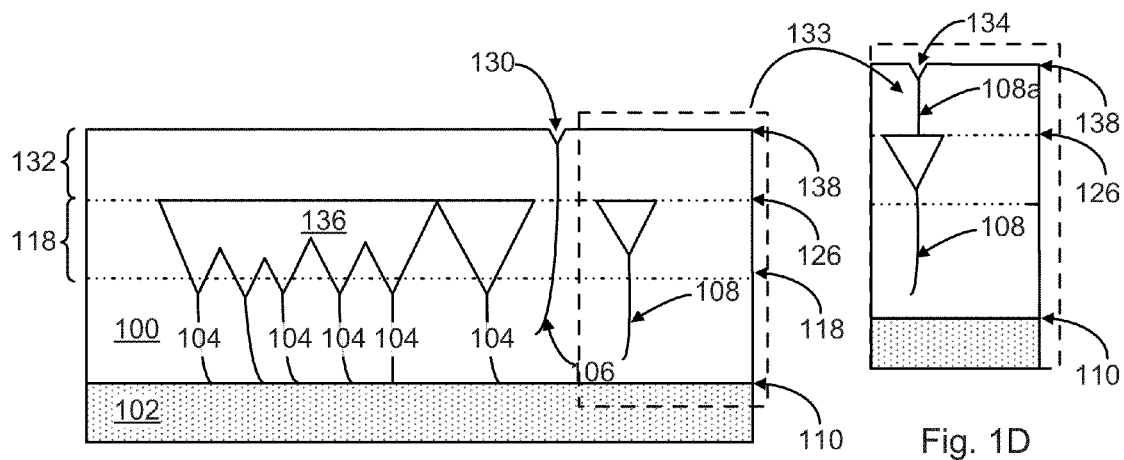

FIGS. 1C-D illustrate overgrowth of a following III-nitride layer on the upper surface of the pitted intermediate layer according to epitaxial lateral overgrowth as is known in the art. During the overgrowth process the material of the following layer epitaxially overgrows and encloses the extended voided regions formed via intersecting growth pits thereby sealing portions of the pits, terminating dislocations located at the bases of the agglomerated growth pits, and preventing their propagation into further III-nitride material thereby being prevented. The epitaxial growth is continued until the material of the following layer coalesces, forming a substantially continuous film, at which point the growth mode can be altered to promote growth of a more vertical growth for producing material to a desired thickness in more effective manner.

All or substantially all of the growth-pits of the pitted layer originate from or are induced by emerging dislocations in an underlying initial III-nitride layer. Therefore, when enclosed, the dislocations cannot continue (or propagate) into a following epitaxial III-nitride layer grown on the pitted layer. Because the following layer grows, at least initially, above and over the agglomerated growth pits via epitaxial lateral overgrowth (ELO), the dislocations are unable to induce dislocations into the following layer. In preferred embodiments, the material of the following layer is substantially the same as, or has crystal properties very closely similar to, the semiconductor material of the intermediate pitted layer, so that the interface between these layers will induce few or no dislocations or dislocations in the following layer. Thereby, in embodiments of the invention, the following layer has improved quality in that it has fewer dislocations than are present at an initial surface.

The particular embodiment illustrated by FIGS. 1B (and 1Bb), 1C, and 1D therefore proceeds by producing a pitted layer with a plurality of intersecting pits, e.g., an intermediate layer with suitably enhanced (e.g., sufficiently open) pit agglomeration areas or regions, originating at all or substantially all of the surface dislocations of the underlying initial layer, then sealing portions of the pitted surface by lateral over growth of a following layer of III-nitride material.

In more detail, FIG. 1A illustrates an initial III-nitride layer 100 (e.g., gallium nitride) grown on substrate 102 during an initial epitaxial process (or otherwise placed on substrate 102, e.g., by layer transfer). In addition, the combination of layers 100 and 102 could constitute a single layer of material such as a free standing GaN or Si wafer). Dislocations, represented at 104, 106 and 108, can arise at interface 110 between the initial layer and the substrate, often because the crystal properties (and other physical properties) of the initial layer material do not sufficiently closely match those of the material of substrate 102 (or the substrate on which layer 100 is grown). These dislocations can continue (or "propagate") along with the growing material into initial layer 100 and disturb the crystal structure as the dislocation intercepts the growing layer surface.

For example, dislocations 104 emerge as surface dislocation 112 where the structure of the surface is more significantly disturbed (in comparison to a defect-free portion of the surface). In comparison dislocation 106 emerges as surface dislocation 116 with little to no obvious disturbance of the surface. For example and not to be limited by theory, the significance of the surface disturbance resulting from the emergence of a dislocation at the growing surface can, in certain cases, be dependent on the characteristics of the dislocation e.g. strain, Burgers vector, nature i.e. screw, edge, mixed type etc. (see for example Hino et al. Applied Physics Letters 76 3421 2000). In the case of GaN, dislocations 104, 106 and 108, are most commonly threading dislocations (TD), and can be numerous in layers epitaxially grown on sapphire substrates. Dislocation 106 can also arise in the bulk of the growing III-nitride material and continue or propagate along with the growing layer to emerge 116 at initial layer surface 118. These types of dislocations typically less significantly disturb the surface. It should be noted that any defect, however originated, can emerge with greater or lesser surface disturbance. A greater disturbance can include, as illustrated by emergence 112, depressions, or hollows, or the like, that are apparent on unaided examination. A lesser disturbance can include, as illustrated by emergence 116, a less significant surface disturbance commonly only apparent upon aided examination e.g. via scanning electron microscopy (SEM), atomic force microscopy (AFM). It is common practice to reveal (commonly referred to as "decorating") such dislocations to make them more readily apparent, e.g., via an etching process.

A subsequent III-nitride layer (the pitted or intermediate III-nitride semiconductor layer) 120 is epitaxially grown on the surface of the initial gallium nitride layer 118. The pitted layer III-nitride layer in certain embodiments has crystal properties, e.g. lattice parameters, thermal expansion coefficient, that are substantially matched to those of initial III-nitride layer 100. The matching of crystal properties between pitted layer 120 and initial layer 100 substantially preserves the material quality from the initial III-nitride layer to the pitted III-nitride layer. Since the initial layer can comprise gallium nitride the pitted layer will substantially preserve the crystal quality of the initial III-nitride layer, e.g. comparable dislocation density, if it too comprises gallium nitride or an alloy thereof.

Pitted III-nitride layer 120 can be epitaxially grown by various methods including hydride (halide) vapor phase epitaxy (HVPE), metallorganic vapor phase epitaxy (MOVPE), and molecular beam epitaxy (MBE). The dislocation density at initial III-nitride layer surface 118 and the growth conditions for pitted layer 120 are optimized in order to promote the formation and intersection of pit like structures that lead to the agglomerated or clustered growth-pits 122 opening at pitted (e.g. rutted, potholed) surface 126. Dislocation 108 is illustrated as resulting in growth pit structure 124, however growth pit structure 124 has not intersected further growth pits and therefore the surface opening produced at surface 126 is less significant than that produced by the clustered or agglomerated region 122.

The density of dislocations in the initial layer surface 118, and the growth time (or equivalently the thickness of the intermediate layer) are selected so that the surface emergences of the agglomerated growth pits are suitable sized to be reliably and effectively overgrown. In addition the agglomerated growth pits are grown in such a way so as to include a plurality of dislocations at their base regions arising from the intersecting growth pits. For example, agglomerated growth pit structure 122 comprises six separate dislocations.

Therefore pitted layer 120 comprises an upper substantially planar surface parallel to the underlying substrate 102 composed of high quality gallium nitride 128 interspersed with interconnected growth-pit features 122 (voids, depressions etc.). For example, it has been found that suitably opened intersecting growth pits are usually formed in pitted (intermediate) layers having thicknesses between 0.1 μm and 1.0 μm.

In addition, in certain embodiment it may be advantageous to employ an initial III-nitride layer which has a significant network of surface dislocation, thereby promoting the formation of growth pits and increasing the probability of growth pit intersection. Therefore in certain embodiments of the invention initial III-nitride surface 118 may comprise a surface dislocation density of greater than $5\times10^7$ cm$^{-2}$, or alternative embodiments a surface dislocation density of greater than $1\times10^9$ cm$^{-2}$ or finally in other alternative embodiments a dislocation density of greater than $1\times10^{10}$ cm$^{-2}$.

It should be appreciated that the intersection of the growth-pits in the pitted intermediate layer leads to agglomerated regions (with two or more growth pits) having substantially discrete voids extended intersecting surface openings 122 in surface 126, preferably with a substantially uniform distribution throughout the pitted layer. Therefore, it is preferred that the original surface dislocations have a substantially uniform distribution in original surface 118. The growth-pits originate from all or a number of the dislocations present at surface 118 of the initial III-nitride layer and extend through all or a portion of the pitted intermediate layer. For example, dislocations 104 are illustrated as forming surface disturbances 112 (FIG. 1A) which intersect to form a portion of agglomerated pit structure 122 in layer 120.

However, some surface dislocations may not lead to agglomerations. For example, dislocation 106 does not form or forms a lesser surface disturbance at surface 118 and as such does not induce a growth-pit structure in pitted layer 120. Dislocation 106 can therefore propagate through layer 120 to emerge at surface 126 where it can result in a surface disturbance 130 of lesser or greater significance. In addition, dislocation 108 produces growth pit 124 upon formation of the intermediate layer, however due to process conditions and the distribution density of dislocations in the initial III-nitride layer growth pit 124 is not capable of intersecting with other growth pit structures. Therefore, dislocation 108 forms a single opening 124 at surface 126 which is reduced in lateral extent compared with those growth pits capable of intersection.

Further, some pit structures may not be directly adjacent to template surface 118 but instead can originate from a propagating dislocation within layer 120. Such growth-pits therefore may not extend through the entirety of pitted III-nitride layer 120 (this layer refers to all the material between surface 126 and surface 118). For example, pit structure 124 in FIG. 1B originates from propagating dislocation 108 within layer 120 so that the apex of this pit structure is not directly adjacent to surface 118. Although a majority, or substantially all, or even nearly all of the growth-pits may extend through the entire pitted layer, it should be understood that some other growth pits may extend only through a fraction of the pitted layer. Therefore, statements herein to the effect that growth-pits originate at all or a number of the dislocations at surface 118 of the template layer should not to be interpreted as excluding embodiments in which some growth-pit structures actually originate within layer 120.

Figure 2:
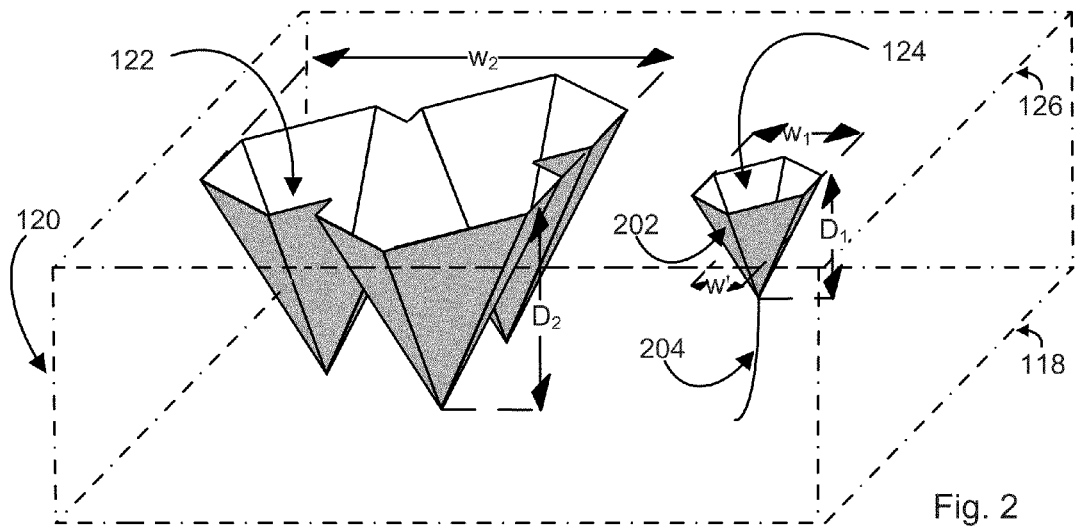
FIG. 2 schematically illustrates growth pits and agglomerated growth pit structure produced by embodiments of the invention.

FIG. 2 represents in exemplary fashion a portion of pitted intermediate layer 120 (delimited by dashed lines) between upper surface 126 and lower surface 118 (which is the upper surface of initial III-nitride layer 100), and further illustrates individual (non-intersecting) growth-pits and growth-pit clustering or agglomeration as commonly formed in preferred embodiments of the invention. The individual growth-pits commonly take on a hexagonal geometry at the emergence with surface 126 (when the semiconductor material of the pitted layer comprises a III-nitride which has a hexagonal crystal structure). A non-intersecting growth pit 124 is illustrated as having an intercept with surface 126 having a width ($W_1$) and a depth ($D_1$) and an inverted pyramid like structure with angled facets 202. Dislocation 204 is illustrated as propagating into pitted layer 120 resulting in the formation of growth-pit structure 124. The depth ($D_1$) of growth-pit 124 is illustrated as encompassing only a portion of pitted layer 120 without limitation. Other individual growth-pits can extend through all of the pitted III-nitride layer.

In contrast, the intersecting growth-pits of agglomerated structure 122 are illustrated as encompassing the entire depth of pitted III-nitride layer 120, originating in the initial gallium nitride layer (not shown in this schematic) and emerging at surface 126. The width of the growth-pits and growth-pit agglomeration can vary from place to place at the surface of the pitted layer. Without limitation, it is believed that the extent to which the growth-pit extends into current semiconductor layer is dependent on the characteristics of the dislocations themselves, e.g. for dislocations the depth (D) may vary for screw, edge and mixed type structures and also on the strain and Burgers vector of the dislocation, and also that the width of an individual pit opening at surface 126 is in part dependent on the characteristics of the dislocation that induced the pit, e.g. W may depend on nature of dislocation type, strain, etc.

Also, the width of growth-pits increase in response to the growth thickness of the pitted III-nitride layer. For example, individual growth-pit 124 has a width ($W_1$) at the intercept with surface 126, however the width of the growth-pit would decrease if the pitted layer thickness decreases. As illustrated in FIG. 2 the width of growth-pit 124 at an earlier stage of pitted III-nitride layer growth is given as W', where as the growth-pit width at a later stage of growth is given as W. It is clear that width W is greater than W'. It is believed without limitation that the increase in pit width is due to the difference in surface energies between the angled pitted facets 000 and the growth facets parallel to surfaces in relation to the growth mechanism proximate to the growth-pits. In this manner, the pit structures enhance the surface distortion produced by the emergent dislocations in both a lateral and axial extent. Such expansion of the surface profile and size of the dislocation (dislocation enhancement) whilst maintaining the high quality of the surrounding gallium nitride crystal makes it easier to process, e.g., overgrow, so that the surface of the following semiconductor layer is improved, i.e. has less dislocations.

The lateral extent of the growth pits is further increased through the intersection of two or more growth pit structures. Pit agglomeration (or clustered) structure 124 represents the intersection of three individual growth pits producing a lateral opening at surface 126 of $W_2$. The individual voided regions of the three growth pit structures combine to form a significantly increased voided region with the three individual dislocations located at the base of the combined voided region.

The growth-pits and agglomerated growth-pits in pitted semiconductor layer 120 are preferably produced by way of carefully selected growth parameters. In certain embodiments, a low temperature growth of layer 120 is found to enhance the formation of pits. In this context low temperature growth is defined as a growth temperature less than that commonly used for the deposition of high quality III-nitrides (e.g. for gallium nitride approximately 1000-1150° C.). For example, the low temperature growth for formation of gallium nitride growth-pits would be on the order of less than 950° C., or on the order of less than 900° C., or alternatively on the order of less than 850° C. In other embodiments the temperature of the growth is maintained at that commonly used for high quality film growth (e.g. ≈1000-1150° C. for gallium nitride) and the pressure of the growth reactor is increased above that commonly utilized for high quality III-nitride deposition. For example, for gallium nitride films the growth pressure would be on the order of greater than 100 mbar, or on the order of greater than 200 mbar, or alternatively on the order of greater than 300 mbar. In other embodiments, the doping level of the III-nitride film is varied to enhance the promotion of growth-pits. For example, Son et al. examined Si doping and the effect on void formation and found pit density decreases with Si doping. The growth parameters for promoting the formation of growth-pit like structures may not be independent of one another and various combinations of parameters may enhance the formation of the growth-pits in the III-nitride film.

The arrangement and density of the clustered growth-pits should be such that, upon sealing portions of the pits, sufficient surface area away from the sealed growth-pits (e.g., surface that is at least free of significant dislocations or disorder) remains for subsequent epitaxial nucleation and for support of the following epitaxial layer. Generally, at least approximately 25% or more of the original area of the surface of layer 120 should remain intact and free of agglomerated growth-pit areas, and preferably at least approximately 50% or more, and more preferably at least approximately 75% or more.

In the further preferred embodiment of the invention, illustrated in FIG. 1Bb, a thin layer of masking material 131 is applied to the surface of the pitted intermediate layer 120 preferably in a manner so that a portion of side facets of the growth pits and agglomerated growth pits (preferably the more disordered portions) are covered while leaving the remaining portions (preferably the less disordered portions) and the un-pitted planar material accessible for subsequent material growth. Preferred masking materials comprise substances which act as anti-surfactants to III nitride growth, thereby limiting the amount of nucleation in masked portions of the structure of FIG. 1Bb. Deposition of anti-surfactant materials onto a secondary material changes the surface growth kinetics by reducing the sticking coefficient (i.e. the probability of adsorption of a chemical species on a surface). Therefore in the case of the GaN that the anti-surfactant can substantially preclude the adsorption and incorporation of Ga onto the anti-surfactant surface and subsequently prevents the nucleation of GaN. In certain embodiments the anti-surfactant material comprises dielectric materials; examples of such materials comprise silicon oxides, silicon nitrides and mixtures thereof.

In an exemplary preferred embodiment of the invention, silicon nitride is utilized as a dielectric masking material 131. The silicon nitride can be formed on the surface of growth pit 124 and agglomerated growth pits 122 employing a number of methods well known in the art, for example. PVD, MBE, sputter deposition and spin-on coating techniques. However, it is advantageous that the deposition of the dielectric masking layer be performed in the reactor chamber utilized for the proceeding growth as it is desirable to perform the entire growth procedure within a single reactor so that a substrate being processed in not exposed to atmosphere (at if ex-situ processing were performed). The ability to exclude ex-situ processing not only simplifies process protocols but also reduces operational costs due to equipment simplifications.

A discontinuous silicon nitride layer can be deposited by CVD processes, e.g., from gaseous silane ($SiH_4$) and ammonia ($NH_3$) under conditions known in the art. CVD reactors for producing III-nitride materials frequently employ $NH_3$ as a Group V element precursor, therefore deposition of silicon nitride only requires the additional of a $SiH_4$ input to the reactor chamber, along with any additional auxiliary fixturing. The growth thickness of the silicon nitride layer 131 is preferable maintained at a mean value between approximately 5 Å and 30 Å, and preferably below approximately preferably 20 Å to further ensure the discontinuity of the masking layer coverage over the substantially planar portion of the surface of intermediate layer article 120.

During the deposition of the thin, discontinuous layer of silicon nitride, a random deposition is achieved in that the material is deposited over single unagglomerated growth pits, agglomerated growth pits as well as the planar non-pitted material.

Silicon nitrides and silicon oxides (and other) masking materials are provided to substantially reduce nucleation and promote lateral overgrowth over the pit structures in order to further promote the reduction of dislocations in the following layer of III-nitride material.

After growth of the pitted III-nitride layer, e.g., layer 120 with clustered pit structure 122 and individual pit structure 124, the pit structures are next sealed (or spanned, bridged etc.). The sealing growth step substantially prevents dislocations located at the base of the growth pit structures from propagating or inducing further defects in a following III-nitride material. Therefore, embodiments of the invention can grow a following III-nitride material with improved quality, i.e. with a reduced dislocation density. Preferred embodiments of the invention seal the dislocations located at the base of the pit structures by over growth of a following layer of III-nitride material. The overgrowth layer can nucleate from the upper high quality non-pitted regions of surface 126 comprising high quality III-nitride material 128 and then can grow over the clustered growth pit structures and their associated dislocations, thereby sealing the defective material and preventing further propagation of dislocations.

FIG. 1C illustrates the initial stages of lateral growth of layer 132 of a following III-nitride material. At least until the growth-pits have been overgrown and bridged by layer 132, conditions can be selected to promote ELO as known in the art. For example, see Hiramatsu et al Journal of Physics: Condensed Matter 13 6961 (2001). Subsequently conditions can be changed to promote vertical growth. The lateral growth nucleates substantially from the high quality upper planar III-nitride material of surface 126 of pitted intermediate layer 128 and less significantly from the faceted regions of the growth pit structures. The lateral growth process therefore overgrows the facetted pit structures and produces high quality III-nitride material as the following layer inherits the crystalline quality of the nucleation areas.

In certain embodiments the following III-nitride materials have relevant properties closely similar to those of the material of the III-nitride pitted layer, so that few if any dislocations will arise at the interface between layer 120 and following layer 132. Thereby, following layer 132 will have better quality, i.e., fewer dislocations, than the initial layer 100 and pitted layer 120. In many embodiments, the following material of layer 132 is substantially the same as the pitted layer material of 120, for example if the pitted layer comprises gallium nitride then the following layer may comprise gallium nitride or an alloy of gallium nitride.

Lateral overgrowth of following layer 132 is continued until a continuous layer of material is produced, as illustrated in FIG. 1D. In more detail, dislocations 104 do not continue into layer 132 because they emerge in agglomerated growth pits which have been overgrown and sealed by the overgrowth of III-nitride layer 132. The size and separation of the agglomerated growth-pits are optimized to facilitate high quality ELO growth, i.e. the separation between ELO growth fronts is maintained at a level to prevent dislocation formation upon coalescence (often due to tilt and twist in the crystal). The ELO growth is illustrated in FIG. 1C where the lateral growth has produced substantially isolated regions of material of the following III-nitride layer, the high quality substantially dislocation free semiconductor material of the pitted layer acting as seed portions for growth. Upon continued lateral growth, the material of the following III-nitride layer coalesces to form a continuous layer. FIG. 1D illustrates that the continuous following layer has substantially fewer dislocations compared with the initial layer 100 and pitted layer 118. Although most or substantially all dislocations are sealed, some dislocations, e.g., dislocation 106, can propagate into the following layer. Dislocation 106 extends through initial layer 100 into layer 118 since the initial lateral extent of the surface opening produced by defect 106 was insufficient to induce a growth pit (as shown in FIGS. 1B and 1Bb). Defect 106 is therefore capable of further propagation in the following layer 132 to produce emergent surface defect opening 130.

Dislocation 108 produced growth pit structure 124 that did not intercept other growth pit structures. Generally, the lateral growth over the isolated growth pit does not produce a further dislocation upon coalescence as shown in FIG. 1D. However, in certain circumstances (as shown by inset 133), during lateral growth over isolated growth pit 124 coalescence in the following layer, further dislocation 108a may be produced that is emergent at dislocation 134. Dislocations 104 produce an agglomerated pit structure, which upon overgrowth forms extend voided region 136. Dislocations 104 associated with the agglomerated pit structure are unable to propagate through the voided region and are therefore terminated within the intermediate layer unable to produce further dislocations in the following III-nitride layer.

In certain embodiments upon coalescence, the thickness of the following III-nitride layer 132 is increased until a desired thickness is achieved (not shown). In greater detail, the following layer is, as stated, formed by lateral overgrowth to produce a continuous film. Upon coalescence of the following film 132, a more three dimensional growth mode can be encouraged in order to produce the desired thickness of material of layer more effectively Additional preferred embodiments of the invention are now described. A first additional embodiment, described with reference to FIGS. 3A-E, is similar to the above embodiment except that an etching step is performed prior to growth of the pitted intermediate layer. A second additional embodiment, described with reference to FIGS. 5A-D, comprises repeating an embodiment of the invention (e.g., the embodiment of FIGS. 1A-D, the embodiment of FIGS. 3A-E) so that the quality of the final layer is even more improved. For brevity, the steps of these additional embodiments that are closely related to corresponding steps of the previously described embodiments are only briefly described. Also, elements of FIGS. 3A-E and 4A-E that are closely similar to corresponding elements of FIGS. 1A-D are identified with the same reference numbers.

Figure 3A:
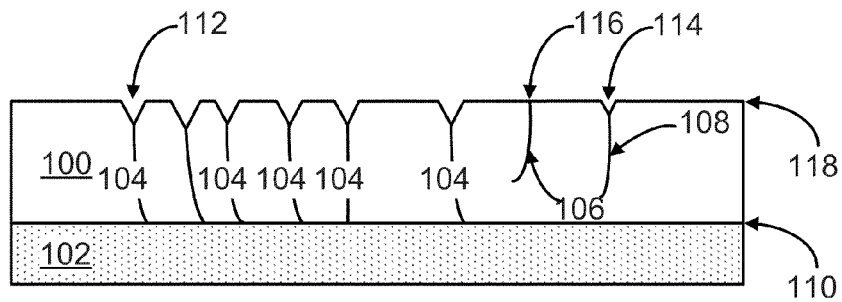
FIGS. 3A, 3B, 3C, 3D, and 3E schematically illustrates a further embodiment of the invention.

Turning now to an additional preferred embodiment illustrated by FIGS. 3A-E and particularly to FIG. 3A, an initial III-nitride layer 100 (e.g. gallium nitride) is formed on a suitable substrate 102 (e.g. sapphire). The initial layer 100 includes a plurality of dislocations 104, 106 and 108 due to dissimilarities between the materials of the initial layer and the substrate (FIG. 3A). The dislocations of the initial layer intersect surface 118 resulting in various degrees of surface disturbance depending on the characteristic of the individual dislocations/dislocations. As seen in the previously described embodiment, dislocation 106 produces little or no disturbance at surface 118.

In methods of this embodiment, the surface of the initial III-nitride layer 118 is subjected to an etching process prior to growth of the pitted intermediate layer. The etching process acts to enhance the lateral extent of surface dislocations of the initial layer to a degree prior to their enhancement by growth of the pitted layer. Such etching is said to "decorate" the surface dislocations of the initial layer by increasing the extent of the surface disturbances produced by all or substantially all of the dislocation emerging at surface 118 of the initial layer 100. The increased extent of the surface disturbances due to etching significantly increases the probability that those dislocation producing little or no surface disturbance (e.g. dislocation 106) in the absence of etching, in fact, induce growth pits in the subsequently growth pitted layer thereby further increasing the probability of a plurality of growth-pits intersecting to form a pit agglomeration region. In this way, additional dislocations emergent at surface 118 (e.g., those having surface emergences that little disturb the crystal structure of the surface in the absence of etching) induce growth-pit features in pitted layer 120, increase the probability of growth pit agglomeration and are thereby prevented from propagating into a final layer, which can therefore be of increased quality.

Figure 3B:
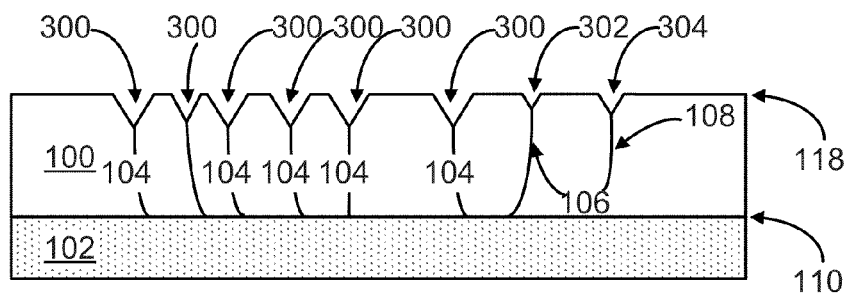

Such selective etching is now described in greater detail with reference to FIG. 3B. The "decoration" (also referred to as "dislocation visualization") step, proceeds by increasing the extents of surface disturbances of emerging dislocations by forming cavities in the initial surface 118 at, or proximate to, the dislocations. The surface of initial layer 110 is etched under conditions so that the material of layer 110 (the "initial" material) is removed primarily or exclusively at or in the vicinity of surface dislocations (or other disordered regions), but is removed little, if at all, from the defect-free portions of the surface. Cavities (or recesses or depressions) 300, 302 and 304 are thereby formed at the locations of most or all of dislocations on the surface of layer 110. It is preferable that dislocation etching conditions be selected so that resulting etch cavities are shaped, sized, and arranged so as to have generally conical or cylindrical shapes that extend down along the principal axis of the dislocation, generally gradually narrowing with depth from their widest portions at the surface.

Etchants (e.g., etching solutions) are known in the art that etch surfaces preferentially at regions of disorder, and less "powerful" versions of these etchants can be used for this etching step. For example, less powerful versions are less acidic, or less basic, or less oxidizing, or the like, than their usual forms. In the specific example of gallium nitride, dislocation selective etching can be performed either in-situ, within a growth reactor, or ex-situ upon removal of the material from the deposition reactor. Plasma, photo assisted, wet chemical and vapor phase etching are all methods that can be utilized. A multitude of etch chemistries can be employed e.g. commonly utilized chemistries include halogens (e.g. hydrogen fluoride, hydrogen chloride, hydrogen bromide and hydrogen iodide), KOH, NaOH, sulfuric and phosphoric acids. In example embodiments the selective dislocation etching is performed in-situ at high temperature, for example above 800° C., utilizing vapor phase etching. For example, gases comprising silane ($SiH_4$) can be employed under known etching conditions. In-situ etching processes they reduce cost and time of the etching step (e.g., loading and unloading of CVD reactor is avoided).

It should be noted that portions of surface 118 that are less disordered may be visualized less significantly by etching than is otherwise achieved at portions that are more disordered. For example, see Physica Status Solidi (B) 228 395 (2001). FIG. 3B illustrates more significant etch cavities 300 formed at the more disordered surface regions 112 (FIG. 3A) that are at, or proximate to, the emergence of dislocations/dislocations 104 (these dislocations in turn originating at interface 110 with substrate 102), and less significant cavity 302 formed at less disordered surface region 116 that is at, or proximate to, the emergence of dislocation 106. Because of the etching step even less significant dislocations now induce growth pits in the following pitted layer and therefore increase the probability of pit agglomeration, whereas without etching, they would have induced a dislocation that could propagate through the pitted layer and into a final layer.

Figure 3C:
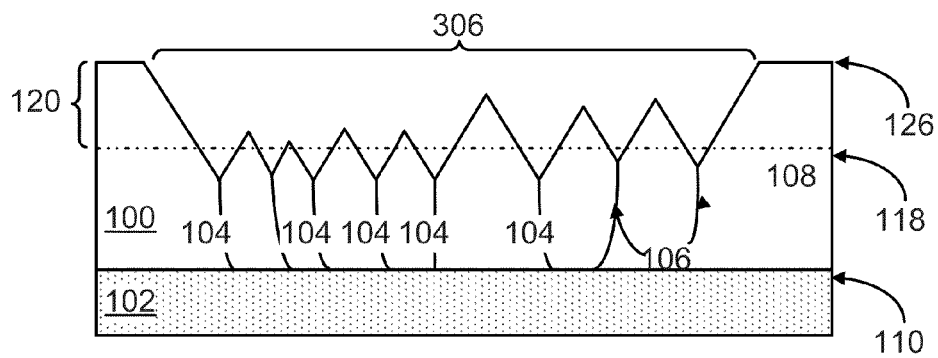

Upon completion of the etch step, this embodiment can proceed substantially as previously described. In this case, a pitted layer 120 (e.g. comprising gallium nitride) is grown from the selectively etched initial III-nitride layer, the pitted layer comprising a planar surface with high quality material and a agglomerated pit structure 306. However, FIG. 3C illustrates that dislocation 106 now produces a growth pit structure as a consequence of the dislocation selective etch process, whereas previously no such pit-like feature was produced (compare FIG. 3C with FIG. 1B or 1Bb). The additional growth pit produced by defect 106 due to the defect decoration process therefore increases the lateral extent of the pit agglomeration region produced as the increased lateral extent of the all the dislocation produces a single agglomerated pit 306.

Alternatively, the surface of the intermediate layer just-grown on the etched initial surface can further be etched. In a further alternative, the intermediate layer can be grown on an un-etched initial surface (as in the embodiment of FIGS. 1A-D), but the surface of the intermediate layer can then be etched. And in a still further alternative, the etch step can be controlled so that the dislocations are sufficiently enhanced so that growth of an intermediate layer can be skipped.

Figure 3D:
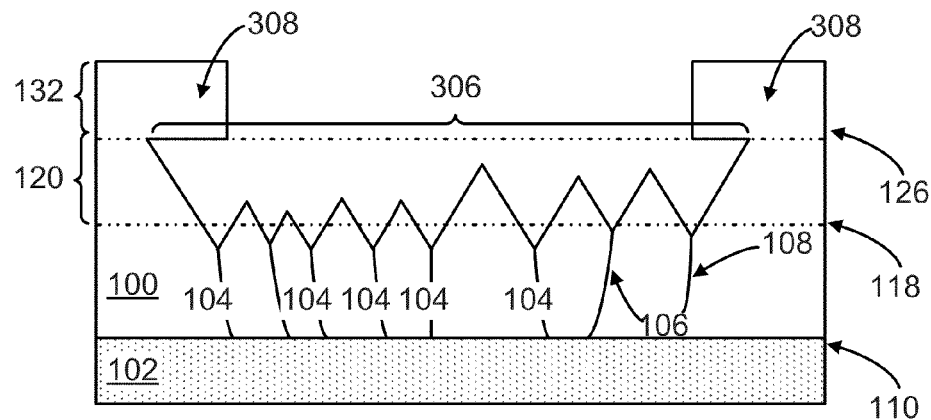
Figure 3E:
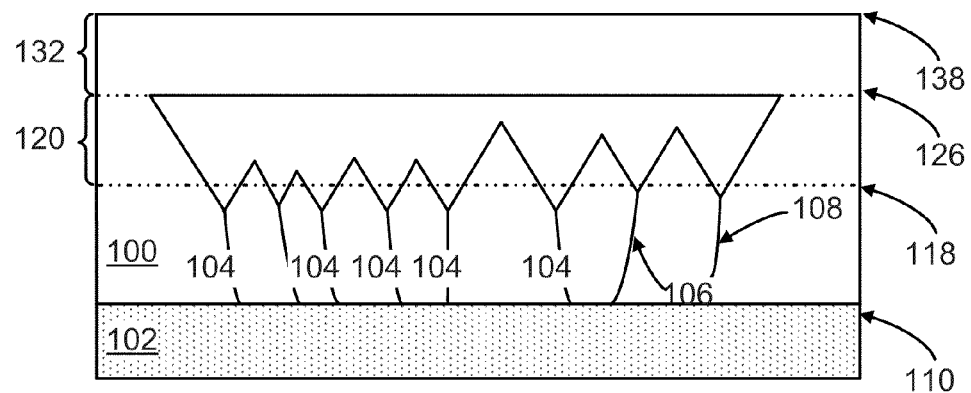

Finally, regardless of the order of etching and intermediate layer growth, FIG. 3D-E illustrate that a III-nitride layer is grown under ELO conditions so that it preferentially nucleates on the high quality III-nitride material bordering the agglomerated growth pit structure 306, but nucleates rarely if at all on the facetted regions of the agglomerated growth pit itself (FIG. 3D). Islands of III-nitride growth 308 form on surface 126 and first grow laterally over the agglomerated growth pit structure, e.g., overgrowing dislocation 104, 106 and 108 located at the base of the agglomerated pit structure 306. The lateral overgrowth continues (FIG. 3E) until islands coalesce to form a substantially continuous film. In this example embodiment all the dislocations in initial III-nitride layer 100 have induced growth pits which have all intersected to produce a single agglomerated growth pit structure. The ELO process is therefore capable of spanning the entire extent of the agglomerated growth pit preventing the propagation of the underlying dislocations.

Finally, upon completion of the ELO process, the growth mode can be altered to promote more vertical growth until the layer reaches a desired thickness (not shown). The resulting final layer thereby has a reduced surface dislocation density in comparison to the initial layer.

The embodiment already briefly described with reference to FIG. 1Bb (i.e., the deposition of a discontinuous layer of a dielectric masking material upon the intermediate layer or upon an etched (decorated) initial surface) is now described with further detail and elaboration with reference to FIGS. 4A-E.

Figure 4A:
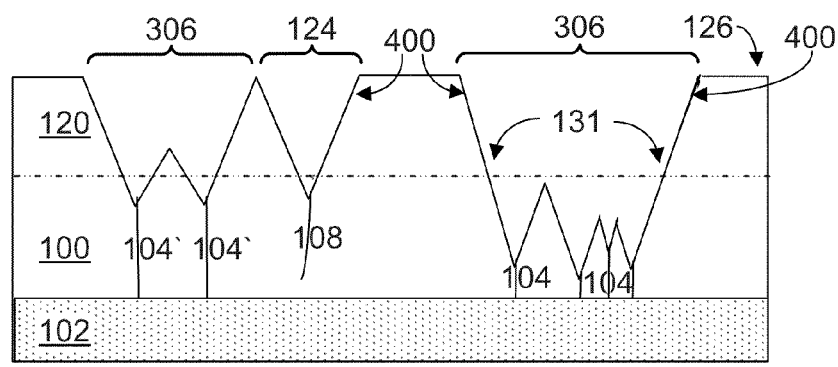
FIGS. 4A, 4B, 4C, 4D, 4E schematically illustrates a further embodiment of the invention.

The methods of the embodiment commence utilizing the semiconductor structure of FIG. 4A, which comprises a semiconductor structure similar to that of FIG. 1B or 3C and formed by the same methods but also including a discontinuous masking layer. Therefore methods for the formation of the structures of FIG. 1B or 3C are not repeated herein for brevity, but rather the additional steps involving formation of the discontinuous masking layer and subsequent growth methods and structures are described. Also, elements of FIGS. 4A-E that are closely similar to corresponding elements of FIGS. 1A-D (and 1Bb) and 3A-E are identified with the same reference numbers.

Turning now to FIG. 4A which comprises initial III-nitride layer 100 (e.g. gallium nitride) formed on a suitable substrate 102 (e.g. sapphire). The initial layer 100 includes a plurality of dislocations 104, 104' and 108 which are utilized to produce agglomerated growth pit structures 306 and growth pit structure 124 with crystalline facets 400 in pitted intermediate layer 120 utilizing methods of the embodiments of the invention as previously outlined.

Figure 4B:
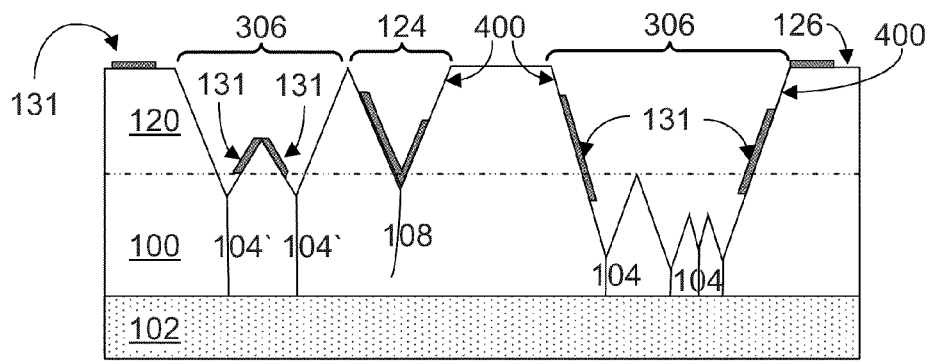

A thin layer of masking material 131 is applied to the surface of the pitted intermediate layer 120 producing the structure of FIG. 4B. In certain embodiments the methods of the invention the masking material is deposited such that a discontinuous layer of a dielectric masking material is formed on the pitted intermediate layer 120 wherein portions of the pitted intermediate layer (including crystalline facets 400 of the pits 306 and 124) are covered with masking material while other portions of the pitted intermediate layer 120 are not so covered. In addition the discontinuous layer of the dielectric masking material 131 may comprise a silicon nitride randomly distributed across the surface of the growth pits and the agglomeration of growth pits, as illustrated in FIG. 4B.

In greater detail, masking materials may comprise substances which act as anti-surfactants to III nitride growth, thereby limiting the amount of nucleation in masked portions of the structure of FIG. 4B. Deposition of anti-surfactant materials onto a secondary material may change the surface growth kinetics by reducing the sticking coefficient (i.e. the probability of adsorption of a chemical species on a surface). Therefore in the case of GaN the anti-surfactant may substantially preclude the adsorption and incorporation of Gallium onto the anti-surfactant surface and subsequently prevents the nucleation of GaN. In certain embodiments the anti-surfactant material may comprise dielectric materials; examples of such materials may comprise silicon oxides, silicon nitrides and mixtures thereof.

As a non-limiting example, a silicon nitride may be utilized as a dielectric masking material 131. The silicon nitride may be formed discontinuously on the surface of growth pit 124 and agglomerated growth pit structures 306 employing a number of methods known in the art, for example. PVD, MBE, sputter deposition and spin-on coating techniques. However, it may be advantageous that the deposition of the dielectric masking layer be performed in the reactor chamber utilized for the proceeding growth as it may be desirable to perform the entire growth procedure within a single reactor so that a substrate being processed is not exposed to atmosphere (as it would if ex-situ processing were performed). The ability to exclude ex-situ processing not only simplifies process protocols but also reduces operational costs due to equipment simplifications.

The discontinuous layer of dielectric masking material may be deposited by CVD processes, e.g., from gaseous silane ($SiH_4$) and ammonia ($NH_3$) under conditions known in the art. CVD reactors for producing III-nitride materials frequently employ $NH_3$ as a Group V element precursor, therefore deposition of silicon nitride only requires the additional of a $SiH_4$ input to the reactor chamber, along with any additional auxiliary fixturing. The growth thickness of the silicon nitride layer 131 is preferable maintained at a mean value between approximately 5 Å and 30 Å, and preferably below approximately preferably 20 Å to further ensure the discontinuity of the masking layer coverage over pitted intermediate layer 120.

During the deposition of the thin, discontinuous layer of silicon nitride 131, a number of deposition parameters may be selected such that the dielectric masking material 131 is randomly distributed across the intermediate layer 120 such that the masking material 131 is randomly deposited over single unagglomerated growth pits 124, agglomerated growth pits 306 as well as the planar non-pitted material 126. In addition the discontinuous layer of dielectric masking material 131 may cover portions of the crystalline facets 400 of the pit structures 124, 306 whilst leaving remaining portions of the crystalline facets 400 of the pits structures 124, 306 exposed and available for subsequent growth processes.

Silicon nitrides and silicon oxides (and other) masking materials are therefore provided to substantially reduce nucleation and promote lateral growth from within some or all of the growth pits 124 and the agglomeration of growth pits 306 thereby allowing the enclosure of some or all of the growth pits and agglomeration of growth sides and further promoting the reduction of dislocations in the following layer of III-nitride material.

Figure 4C:
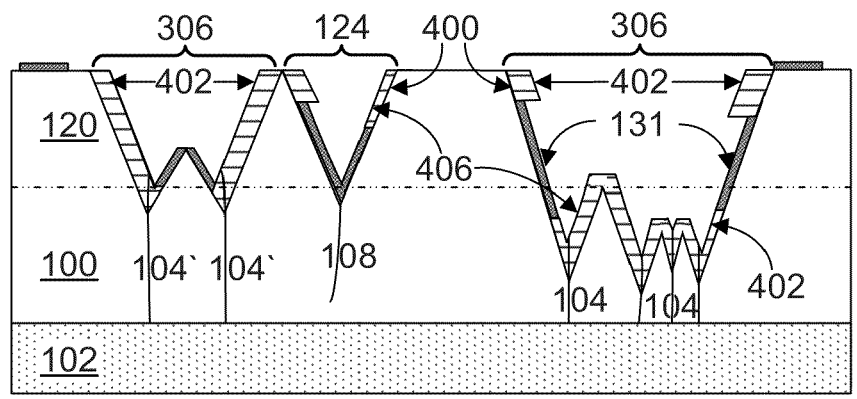

In more detail, the semiconductor structure of FIG. 4C, illustrates the initial stage of a plurality of lateral growth regions 402 from the exposed portions of growth pit structure 124 and agglomerated growth pit structure 306. Lateral growth regions 402 may be seeded from the exposed portions of crystalline facets 400 of growth pit structures 124 and agglomerated growth pit structures 306. The initial stages of lateral growth regions 402 therefore nucleate from the exposed portions of the crystalline facets 400 which are substantially free of dielectric masking material. Growth parameters for enabling lateral growth are known in the art and have been outlined previously. The lateral growth regions may comprise one or more free surfaces 406 which evolve (i.e., proceed in the growth direction) with the continued grow of lateral growth regions 402. In certain embodiments the one or more free surfaces may alter the propagation direct of a plurality of the emergent dislocations.

Figure 4D:
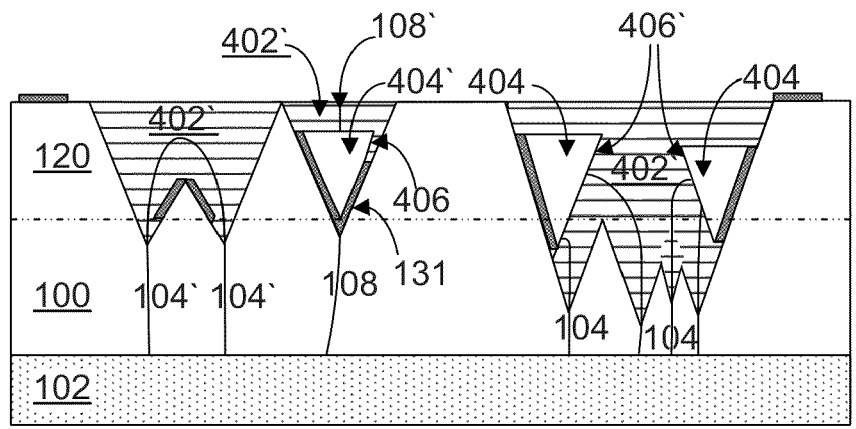

The semiconductor structure of FIG. 4D illustrates the epitaxial growth on the intermediate layer under third epitaxial growth conditions selected to encourage lateral growth from within some or all of the growth pits and the agglomeration of growth pits. For example, continued lateral growth of lateral growth regions 402 may be performed until lateral growth regions 402 coalescence to form coalesced lateral growth regions 402'. The lateral growth from exposed regions of the crystalline facets of the growth pit structures and agglomeration of growth pit structures may produce a plurality of functional cavities 404, wherein each of the plurality of functional cavities may comprise one or more free surfaces 406 substantially free of dielectric masking material.

The one or more free surfaces 406 of the plurality of functional cavities 404 may alter the propagation direction of a plurality of the emergent surface dislocation, such that a plurality of the emergent dislocations may intersect a plurality of the functional cavities. For example, emergent dislocations 104 of FIG. 4D are illustrated as bending and intersecting function cavities 406 and emergent dislocation 108 is illustrated as intercepting functional cavity 402'.

Additional embodiments of the invention may also comprise terminating a plurality of the emergent surface dislocation (e.g., dislocations 104) on the one or more free surfaces 406' of the functional cavities 404. In more detail, the one or more free surfaces of the functional cavities may encourage the emergent surface dislocations to alter their propagation direction during the lateral growth process.

The free surface may act to prevent the further propagation of a plurality of the emergent surface dislocations such that the following layer of semiconductor material has fewer surface dislocations than the initial semiconductor surface.

In other embodiments of the methods of the invention, an emergent surface dislocation may alter propagation direction and intercept a secondary emergent surface dislocation. The two intercepting emergent surface dislocation may annihilate each other when the emergent surface dislocations have certain physical properties, i.e., when the two intercepting emergent surface dislocations have equal and opposites Burgers vectors. Such an embodiment of the methods of the invention is illustrated in FIG. 4D by emergent dislocations 104'. As is evidently illustrated in FIG. 4D, emergent surface dislocations 104' alter propagation direction due to the methods of the invention (i.e., including agglomerated growth pit formation, discontinuous masking material deposition and lateral growth) and intercept one another resulting in annihilation of dislocations 104', and a further reduction in the dislocation density in the III-nitride material.

In other embodiments of the methods of the invention, the emergent surface dislocations may not intercept and terminate on a free surface of a functional cavity and in addition may not intercept a secondary emergent surface dislocation with equal and opposite Burgers vector. In such examples, the emergent surface dislocation may propagate through the semiconductor structure without being terminated. For example, emergent dislocation 108 of FIG. 4D is illustrated as intercepting functional cavity 404'. However, emergent dislocation 108 intercepts the dielectric masking material of functional cavity 404 and therefore maybe replicated in the following semiconductor material 132 (FIG. 4E) as emergent dislocation 108'.

Figure 4E:
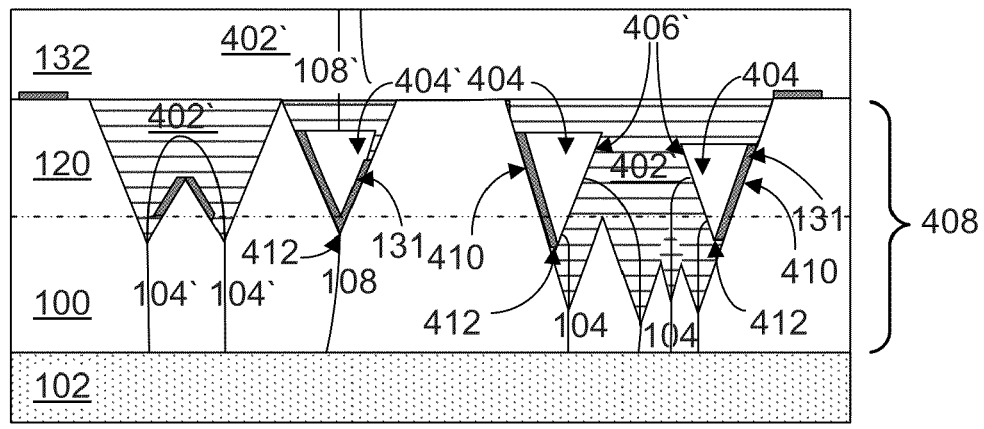

The semiconductor structure of FIG. 4E illustrates the epitaxial growth of following semiconductor layer 132. Substantially continuous following semiconductor layer 132 may have fewer surface dislocations than the initial semiconductor surface due the embodiments of methods of the invention previously outlined.

As illustrated in FIG. 4E, emergent dislocations 104 may be terminated on free surfaces 406' of functional cavities 404 and therefore may not propagate in following semiconductor layer 132. In addition, emergent dislocation 104' may intercept and annihilate one another due to methods of the invention and therefore such dislocations may not propagate into following semiconductor layer 132. However, emergent dislocation 108 may propagate past functional cavity 404' and propagate into and through following semiconductor layer 132.

The embodiments of the invention may also comprise the semiconductor structures formed by the outlined methods. For example, a group III-nitride semiconductor structure may comprise (see FIG. 4E) a first layer 408 comprising a plurality of functional cavities 404, wherein each functional cavity may comprise one or more free surfaces 406. The one or more free surfaces 406 may be substantially free of a dielectric masking material 131 whilst the plurality of functional cavities may also comprise one or more bound surface 410 adjoining the dielectric masking material 131, bound surfaces 410 may comprise the surfaces of the functional cavities upon which masking material is deposited.

The semiconductor structure may also comprise a plurality of dislocations 104, a plurality of the dislocations may intercept one or more free surfaces 406' of each of the function cavities 404 of the first layer 408, wherein a plurality of the dislocations may terminate. The semiconductor structure may also include a continuous following layer 132 overlying the first layer 408 having fewer dislocations than in the first layer. In certain embodiments of the invention the plurality of functional cavities 404 may include an apex 412 within first layer 408, the apex of the functional cavities may have a random distribution through out the thickness of the first layer, i.e., such that the apexes are positioned at differing thicknesses throughout the first layer.

An additional preferred embodiment repeats one or more times other embodiments of the invention (e.g., the embodiment of FIGS. 1A-D, the embodiment of FIGS. 3A-E, or another embodiment), and is now described with reference to FIGS. 5A-D. Each following layer that results from each repeat can have successively improved quality.

Figure 5A:
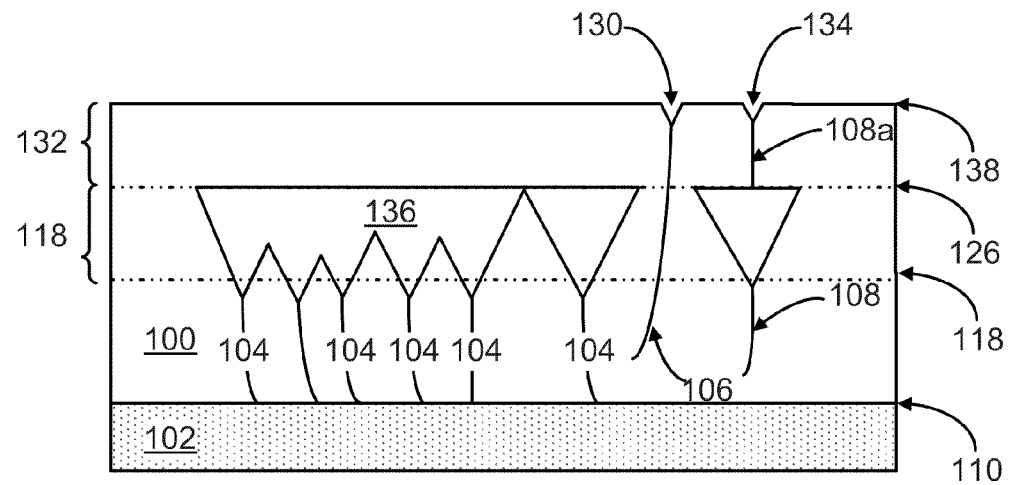
FIGS. 5A, 5B, 5C, and 5D schematically illustrate the repeated use of embodiments of the invention.

Turning first to FIG. 5A, this figure illustrates a structure that can result from performing once an embodiment of the invention. For brevity and convenience, this structure is illustrated as being the same as the structure illustrated in FIG. 1D which has been produced by the steps illustrated in FIGS.

1A-D. As illustrated in FIG. 5A (and FIG. 1D), dislocation 106 has propagated into and through semiconductor layer 132 resulting in surface disturbance 130 on III-nitride surface 138. In addition dislocation 108, which was capable of producing a growth pit structure but unable to intersect with other growth pit structures, propagates as dislocation 108a upon coalescence over the growth pit structure resulting in the emergence dislocation 134 at surface layer 138.

Figure 5B:
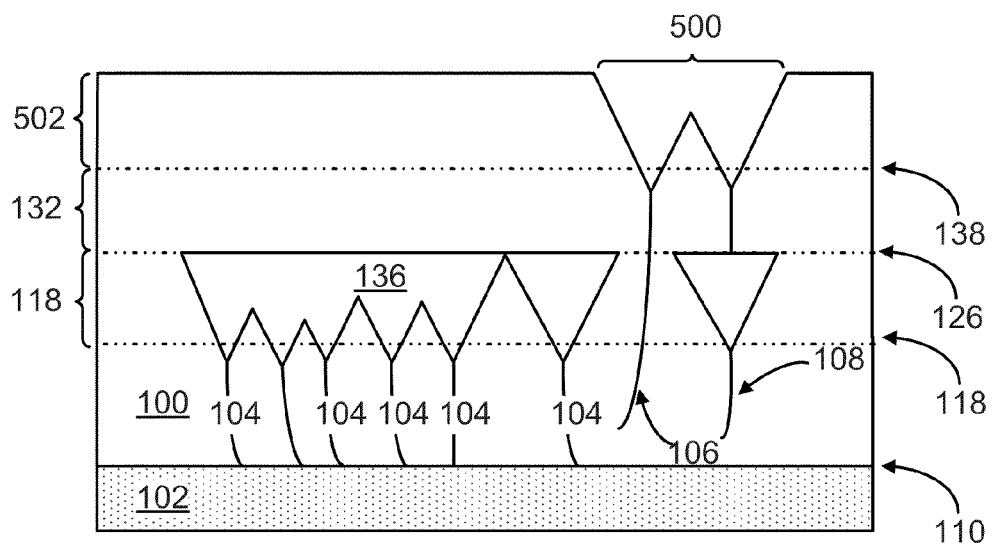
Figure 5C:
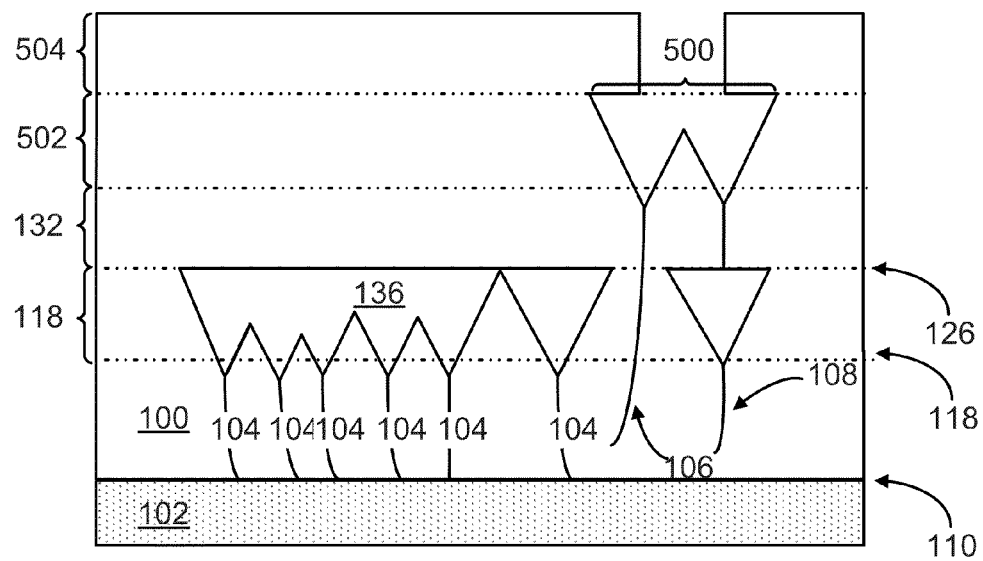
Figure 5D:
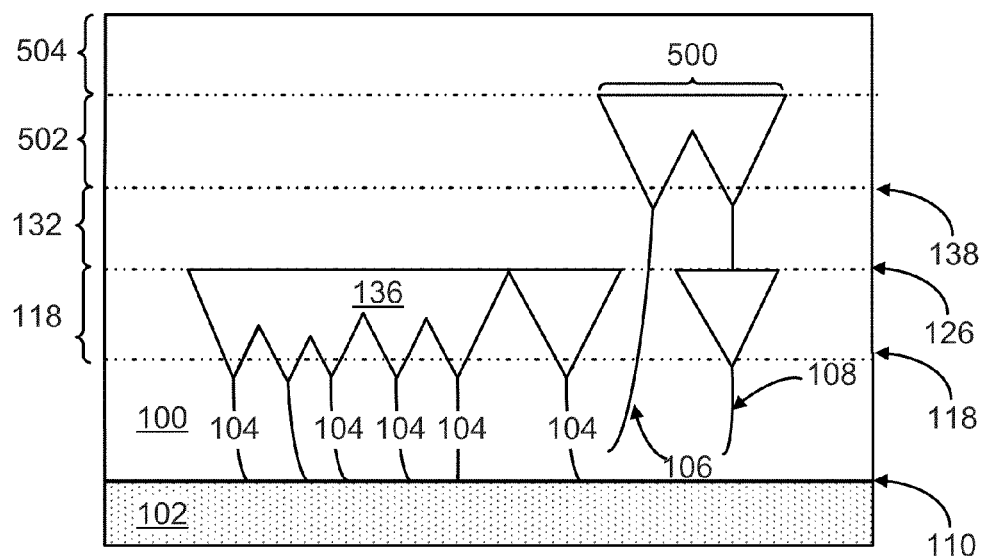

Next, the previously described steps are applied to this structure. The main bodies of FIG. 5B, FIG. 5C and FIG. 5D, illustrate the outcomes when steps similar and corresponding to the steps leading to FIG. 1B (and also FIG. 1Bb), FIG. 1C and FIG. 1D respectively, are performed starting with FIG. 5A. Alternatively, one or both of the dielectric masking step illustrated in FIG. 1Bb and the etching step illustrated in FIG. 3B can also be performed during this repeat.

Turning first to the main bodies of FIGS. 5B-D, FIG. 5B illustrates growth of further pitted III-nitride layer 502 under the conditions previously outlined that promote formation of growth pits and the interception of such growth pits to produce agglomerated pit structure 500. Agglomerated growth pit structure 500 is induced by the surface disturbances at the surface emergence of dislocations 106 and 108 (which previously had propagated through following layer 132 to surface 132).

FIG. 5C illustrates a further following layer 504, which as previously described, is initially grown over the agglomerated pitted regions of pitted III-nitride layer 502 until coalescence of the separate growth fronts (FIG. 5D), thereby producing a final layer with reduced dislocation density. If necessary growth with a more vertical growth mode is then performed until further following layer 504 of a preferred thickness is formed.

As illustrated, dislocations 106 and 108 now induce growth pits which intersect to form agglomeration area 500 in pitted layer 504, and subsequent growth of another following layer 504 by ELO seals the agglomeration region. Accordingly, these additional dislocations are terminated at this layer and do not propagated into or through further following layer 504. Thereby, the second following layer 504 will have better quality than the first following layer 132, which in turn will have better quality than the initial layer 100. Specifically, the densities of dislocations in layer 504 are less than in layer 132, which in turn are less than in layer 100.

Finally, the invention includes semiconductor structures produced by the methods of this invention which have included within evidence that the methods of this invention have been performed one or more time. Such a semiconductor structure can include evidence of a single repetition of the embodiment, which as in FIG. 1D, typically comprises a plurality of enhanced and intersecting dislocation structures, e.g., growth pits that are intersecting one or more other growth pits and that are arranged along a plane internal to the structure. A further such semiconductor structure can show evidence or two repetitions of the former embodiment. As in FIG. 5D, such evidence can typically include two or more spaced apart planes along which are arranged a plurality of intercepting growth pits forming a plurality of agglomerated pit structures. Preferably, the densities of intercepting dislocation structures decrease from plane to plane towards the final surface.

The above described embodiments are intended to be exemplary but not limiting. For example, methods of the invention can include differing numbers of repetitions and differing arrangements of the basic steps of the invention, e.g., dislocation enhancement, dislocation intersection, and layer over growth, that are within the previously described principles and goals of the invention. Further, in alternative embodiments, dislocation enhancement can be performed by other than pitted-layer growth or etching and so forth.

Example

Figure 6A:
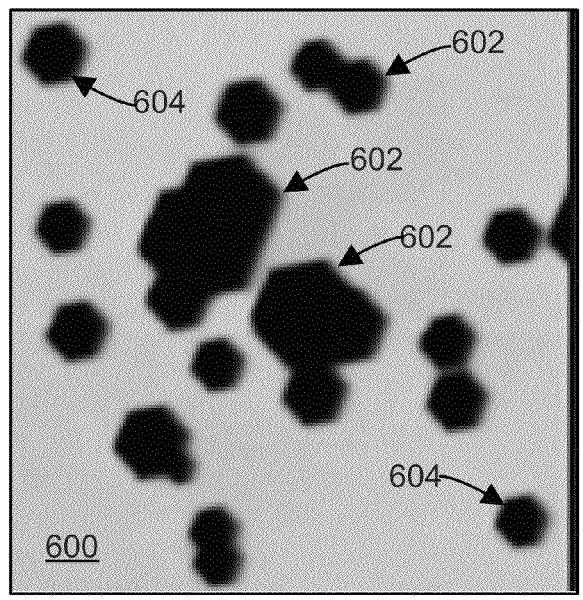
FIGS. 6A and 6B illustrate practical examples of embodiments of the invention.
Figure 6B:
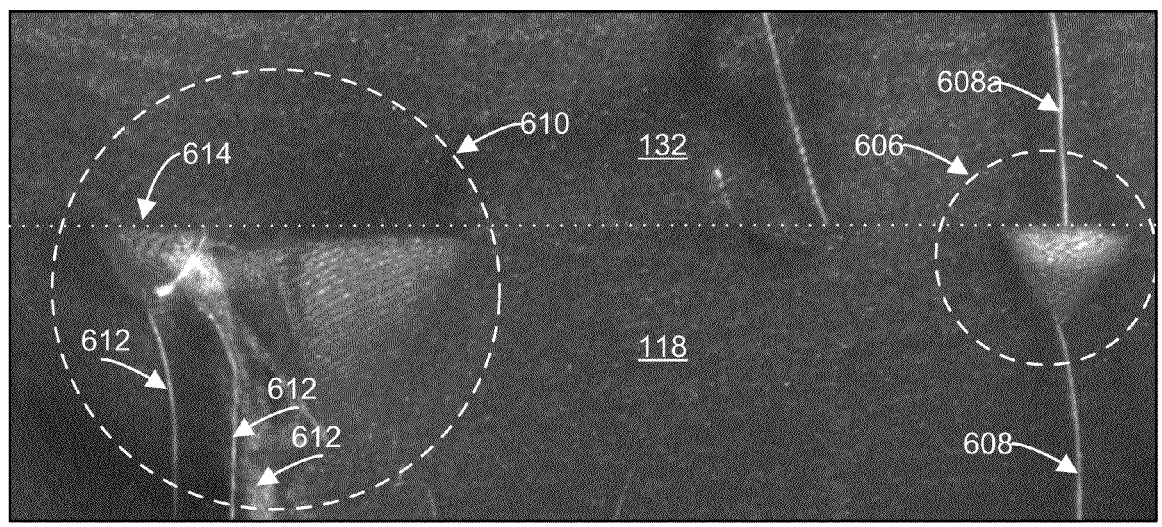

FIGS. 6A-B illustrates a gallium nitride structure produced by preferred embodiments of the invention. Specifically, a (0001) sapphire substrate was utilized for growth of an original GaN layer. (Note that a number of process stages can be performed prior to growth including a substrate cleaning cycle to remove unwanted contaminants (e.g. a high temperature bake in hydrogen containing ambient), nitridization of the upper surface of the substrate, or further surface pretreatments dependent on the chemistry of both the growth material and the base substrate.) Gallium Nitride layer 100 growth commenced with deposition of a nucleation layer at a temperature of approximately 500° C. for a period of 20 mins. The temperature of the reactor was subsequently raised for thermal treatment of the nucleation layer and the growth of high quality gallium nitride. In this example the temperature in the reactor was raised to a temperature of 1100° C. in a time period of 20 mins and growth was carried out for 90 minutes to produce a layer thickness of approximately 1.0-2.5 μm. The temperature of the reactor was then reduced to approximately 890° C. for the growth of the pitted intermediate layer 120, in this example the reduced temperature growth was continued for 90 mins until a pitted layer thickness of approximately 150 nm is produced.

FIG. 6A provides an image produced via an atomic force microscope (AFM) of the GaN structure after completion of the above steps (schematically illustrated in FIGS. 1A and 1B). As noted the surface comprised high quality gallium nitride 600 and dark hexagonal surface openings of pit like structures, example pit like structures 602 and 604. Pit structures similar to pit structure 604, are single unclustered growth pits and are analogous to the growth pit produced via dislocation 108 in FIG. 1B. Pit structures similar to pit structure 602 are agglomeration areas where two or more growth pits have intersected and are analogous to structure 122 in FIG. 1B. (Only selected clustered structures have been labeled; other clustered structures are apparent in this figure.) Agglomerated pit structures similar to pit structure 602 have increased lateral extent of their surface openings in the III-nitride layer in comparison to individual pit structures similar to pit structure 604.

The example gallium nitride surface 600 shown in FIG. 6A was well suited for further growth processes, e.g. lateral overgrowth of the growth pits and pit agglomeration areas for producing a following low-dislocation gallium nitride material. The structure was replaced in the growth reactor and the temperature and precursor flow parameters for the initial stages of bulk growth were optimized for ELO, resulting in a 2D growth mode. Upon III nitride coalescence into a continuous film the flow parameters were again varied for growth of the remaining bulk GaN material FIG. 6B shows a cross section transmission electron micrograph (TEM) image of the III-nitride sample upon completion of the lateral overgrowth stage of the process (schematically illustrated in FIGS. 1C and 1D). The lower portion (below the horizontal dotted line) of this TEM image corresponds to the intermediate pitted layer 118 of FIG. 1D and is labeled as such. The upper portion is analogous to the following layer of III-nitride material produced by lateral overgrowth, i.e. region 132 of FIG. 1D and is again labeled as such.

The region within circle 606 illustrates a single growth pit produced by dislocation 608. Upon lateral overgrowth and coalescence, the original dislocation propagated as dislocation 608a within the following layer of III-nitride material. This illustrates that a single unclustered growth pit may not be successful in preventing dislocation propagation.

The region within circle 610 illustrates an agglomerated area formed by intersection of the plurality of growth pits induced by dislocations 612. The outline of a number of intersecting growth pit structures can be discerned within region 610; specifically, growth pit 614 intersects other growth pits. In the upper portion above the dotted line, it can be seen that GaN has laterally overgrown agglomeration 614 and that none of the original dislocations 512 are visible. It is believed that dislocations 612 have been terminated by the agglomeration and overgrowth processes of the invention. Therefore, the number of dislocations in the lateral overgrowth region 132 is less than the number of dislocation in the lower region 118. A final surface dislocation density of gallium nitride on the order of less than $5 \times 10^7$ cm$^{-2}$ was observed.

It should be understood that for the examples give above the described physical parameters, e.g. times, temperatures etc are exemplary only and are not to be taken as limiting. For example, the growth temperature range, growth time, etc are suitable for III-nitride, e.g., GaN. For other III-nitride materials these parameters can be different.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims. In the following (and in the application as a whole), headings and legends are used for clarity and convenience only.

A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method for forming a III-nitride semiconductor structure, the semiconductor structure comprising an initial III-nitride surface having a plurality of emergent dislocations, the method comprising exposing the initial surface to a sequence of epitaxial growth conditions selected so as to encourage:
   opening of growth pits in an intermediate III-nitride layer growing on the initial surface, the growth pits being associated with the surface dislocations in the initial III-nitride surface;
   intersection of two or more of the growth pits opened in the growing intermediate layer into agglomerations of growth pits; and
   lateral growth of a following III-nitride layer to enclose some or all of the growth pits and the agglomerations of growth pits, wherein the lateral growth continues at least until the following layer has substantially continuous lateral extent, wherein the following layer is formed with a dislocation density that is less than that of the initial surface, and wherein the lateral growth nucleates from portions of growth pits, and agglomerations of growth pits, not covered by a discontinuous layer of a dielectric masking material.

2. The method of claim 1 wherein the growth conditions for encouraging the opening of growth pits are substantially similar to the growth conditions for encouraging the intersection of growth pits.

3. The method of claim 2 wherein the growth conditions for encouraging the opening and intersection of growth pits comprise temperatures of less than 950° C., pressures of greater than about 100 mb, or both.

4. The method of claim 1 wherein the sequence of growth conditions further comprises conditions encouraging growth of the dielectric masking material that are subsequent in sequence to the conditions for encouraging opening and intersection of growth pits but are prior in sequence to the conditions for encouraging lateral growth.

5. The method of claim 1 further comprising repeating the sequence of growth conditions without removal of the III-nitride layer being formed from the growth chamber.

6. The method of claim 1 wherein the opening and intersection of growth pits continues as long as a plurality of individual growth pits have lateral extents of less than about 5 μm.

7. The method of claim 1 wherein the discontinuous layer of the dielectric masking material comprises a silicon nitride randomly distributed across the surface of the growth pits and the agglomerations of growth pits.

* * * * *